(12) United States Patent
Yamane

(10) Patent No.: US 7,821,313 B2
(45) Date of Patent: Oct. 26, 2010

(54) DLL CIRCUIT

(75) Inventor: Fumiyuki Yamane, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/475,269

(22) Filed: May 29, 2009

(65) Prior Publication Data
US 2010/0052750 A1 Mar. 4, 2010

(30) Foreign Application Priority Data
Aug. 29, 2008 (JP) .............................. 2008-221064

(51) Int. Cl.
*H03L 7/06* (2006.01)
(52) U.S. Cl. ..................... 327/158; 327/149; 327/161
(58) Field of Classification Search ................. 327/149, 327/152, 153, 158, 161
See application file for complete search history.

(56) References Cited

U.S. PATENT DOCUMENTS

| | | | | |
|---|---|---|---|---|
| 6,970,028 B2* | 11/2005 | Ishikawa | ..................... | 327/158 |
| 7,035,366 B2* | 4/2006 | Tokutome et al. | ........... | 375/371 |
| 7,626,432 B2* | 12/2009 | Yamane | ..................... | 327/158 |
| 7,728,640 B2* | 6/2010 | Yamane | ..................... | 327/161 |
| 2008/0252343 A1 | 10/2008 | Yamane | | |

FOREIGN PATENT DOCUMENTS

JP 2004-260663 9/2004

* cited by examiner

*Primary Examiner*—Lincoln Donovan
*Assistant Examiner*—Patrick O'Neill
(74) *Attorney, Agent, or Firm*—Knobbe, Martens, Olson & Bear LLP

(57) ABSTRACT

A DLL circuit includes an input circuit generating a synchronization reference signal, a first delay unit delaying the synchronization reference signal to generate a plurality of delayed synchronization reference signals and selecting one of the delayed synchronization reference signals, a timing offset circuit adjusting a synchronization position of the delayed synchronization reference signal to generate a signal to be synchronized, a phase comparison circuit comparing phase of the synchronization reference signal with that of the signal to be synchronized, a first control circuit selecting an output signal of the first delay unit, a second delay unit delaying the synchronization reference signal or the signal to be synchronized to generate a plurality of delayed signals, a configuration information memory storing configuration information, and a second control circuit selecting an output signal of the second delay unit if the comparison result of the phase comparison circuit is within a predetermined range.

14 Claims, 11 Drawing Sheets

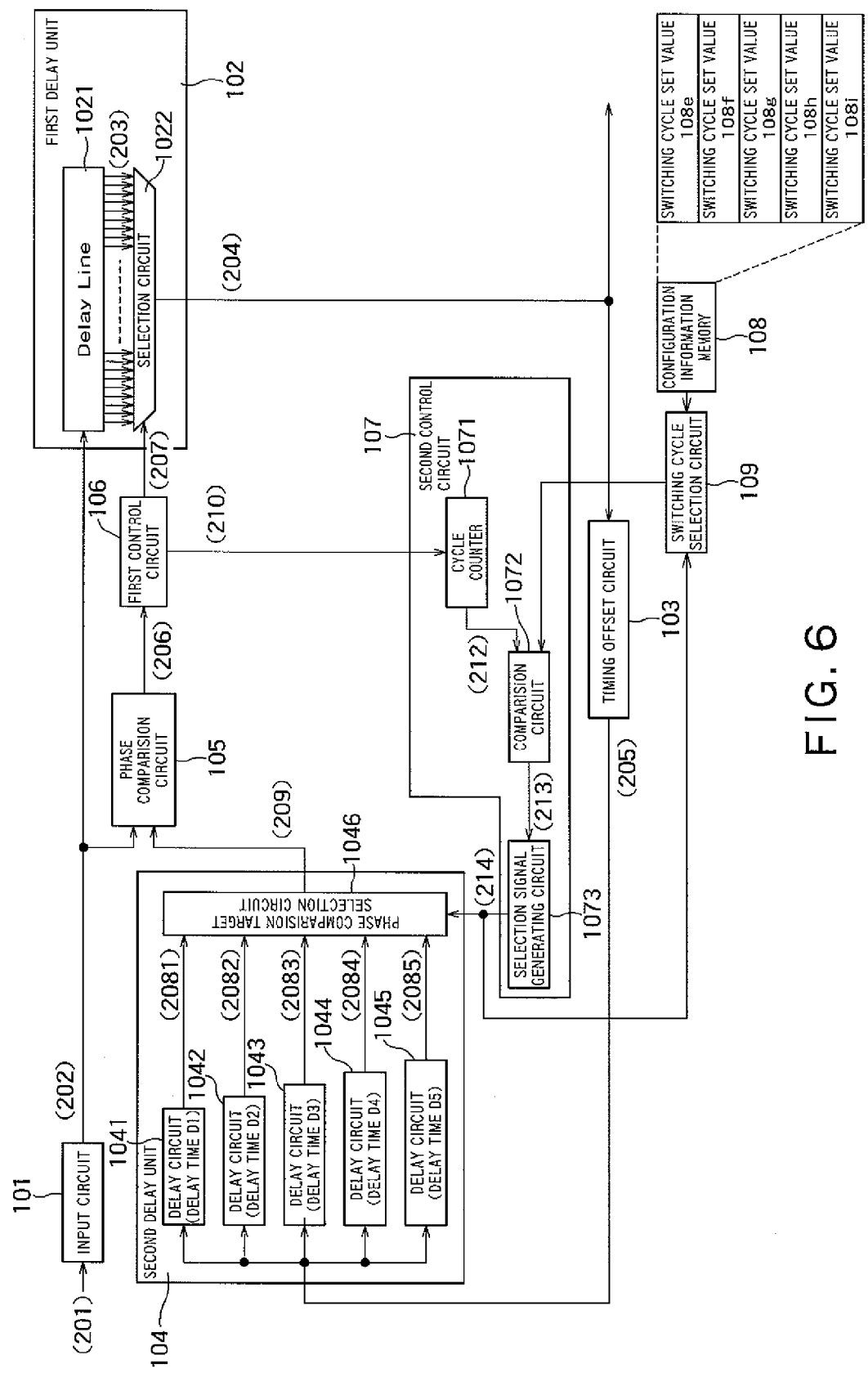
F I G. 6

(A)

(B)

DLL CIRCUIT

CROSS-REFERENCE TO RELATED APPLICATION

This application is based upon and claims the benefit of priority from the prior Japanese Patent Application No. 2008-221064, filed on Aug. 29, 2008; the entire contents of which are incorporated herein by reference.

BACKGROUND OF THE INVENTION

The present invention relates to a DLL (Delay Locked Loop) circuit and, more particularly, to a DLL circuit having the function of reducing intensity of electromagnetic radiation noise.

An LSI (Large Scale Integration) mounted on an electronic device emits electromagnetic waves in response to power consumption and to operation frequency. Electromagnetic waves exert an adverse influence such as electromagnetic radiation noise on an entire electronic device. The main cause of the electromagnetic radiation noise is electromagnetic waves generated from a DLL circuit in the LSI and other circuits using an output signal (DLL output signal) of the DLL circuit. In particular, strong electromagnetic waves are generated from the other circuits using the DLL output signal.

On the other hand, as electronic devices are sophisticated and the integration technique has improved in recent years, the power consumption, operation frequency, packaging density, and the number of LSIs mounted on an electronic device have been increasing. As a result, the intensity of electromagnetic waves (electromagnetic radiation intensity) emitted from the LSI increases, and the influence of electromagnetic radiation noise exerted on the electronic device is becoming unignorable.

An ordinary LSI has a DLL circuit. When the DLL circuit is in a locked state (that is, the DLL circuit and the LSI having the DLL circuit are in an operating state), the frequency of a DLL output signal of the DLL circuit has a constant value (DLL locked frequency). As a result, the electromagnetic radiation intensity at the DLL lock frequency becomes very high.

A DLL circuit suppressing minimum delay time (minimum slew rate) of delay time which can be adjusted in a wide range is known (Japanese Patent Application Laid-open Publication No. 2004-260663). However, the Japanese Patent Application Laid-open Publication No. 2004-260663 does not disclose means for reducing the electromagnetic radiation noise caused by the DLL circuit.

Therefore, the electromagnetic radiation intensity of the conventional DLL circuit and that of an LSI having the DLL circuit is high. There is a problem such that an electronic device having the LSI is adversely influenced by the electromagnetic radiation noise.

Furthermore, a peak of the electromagnetic radiation intensity of the conventional DLL circuit and that of the LSI having the DLL circuit appears at particular operation frequency. Since this peak is very high, the electronic device having this LSI is adversely influenced by the electromagnetic radiation generated from this LSI. Therefore, the LSI having DLL circuit is required to have a function to prevent EMI (Electro Magnetic Interference).

However, the function to prevent EMI depends on configurations of the electronic device. Therefore, if the function to prevent EMI having scalability, for example the function for shifting distribution of frequency and for controlling shape of distribution of frequency, is not used, a various restrictions is imposed users which use the LSI.

SUMMARY OF THE INVENTION

According to the aspect of the present invention, there is provided a DLL circuit comprising:

an input circuit configured to generate a synchronization reference signal on the basis of an input signal;

a first delay module configured to delay the synchronization reference signal to generate a plurality of delayed synchronization reference signals and to select one of the delayed synchronization reference signals;

a timing offset circuit configured to adjust a synchronization position of the delayed synchronization reference signal selected by the first delay module to generate a signal to be synchronized;

a phase comparison circuit configured to compare phase of the synchronization reference signal with that of the signal to be synchronized;

a first control circuit configured to select an output signal of the first delay module on the basis of a comparison result of the phase comparison circuit;

a second delay module configured to delay the synchronization reference signal or the signal to be synchronized to generate a plurality of delayed signals;

a configuration information memory configured to store configuration information for shifting distribution of frequency; and a second control circuit configured to select an output signal of the second delay module based on the configuration information stored in the configuration information memory in the case where the comparison result of the phase comparison circuit is within a predetermined range.

BRIEF DESCRIPTION OF THE DRAWINGS

FIG. 6 is a circuit diagram showing the configuration of a DLL circuit of the second embodiment of the invention.

DETAILED DESCRIPTION

Embodiments of the present invention will be described hereinbelow with reference to the drawings. The following embodiments are aspects of the present invention and do not limit the scope of the invention.

Embodiment 1

A first embodiment of the present invention will be described. The first embodiment of the present invention is an example of DLL circuit having a selection signal generation circuit configured to generate a selection signal based on configuration information.

Figure 1:
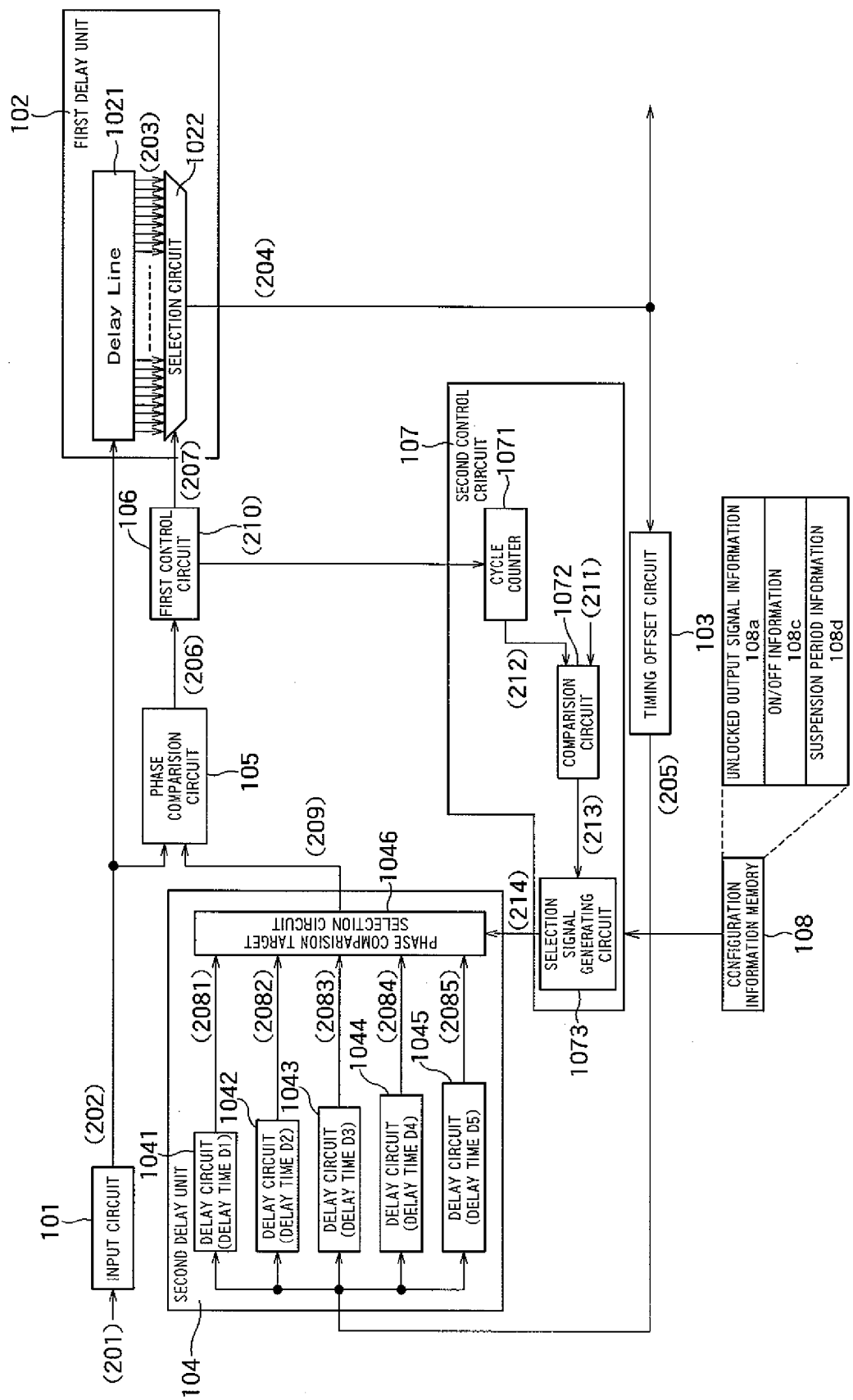
FIG. 1 is a circuit diagram showing the configuration of a DLL circuit of the first embodiment of the invention.

Configuration of a DLL circuit of the first embodiment of the present invention will be described. FIG. 1 is a circuit diagram showing the configuration of a DLL circuit of the first embodiment of the invention.

As shown in FIG. 1, the DLL circuit of the first embodiment of the present invention has an input circuit 101, a first delay module 102, a timing offset circuit 103, a second delay module 104, a phase comparison circuit 105, a first control circuit 106, a second control circuit 107, and a configuration information memory 108.

As shown in FIG. 1, the input circuit 101 is connected to external circuits (not shown), a delay line 1021 (describe later) of the first delay module 102, and the phase comparison circuit 105. The input circuit 101 is configured to receive a DLL input signal (201), to generate a "synchronization reference signal (202)" which is a basis of synchronization from the DLL input signal (201), and to output the synchronization reference signal (202) to the first delay module 102 and the phase comparison circuit 105.

As shown in FIG. 1, the first delay module 102 has the delay line 1021 and selection circuit 1022. The delay line 1021 and the selection circuit 1022 are serially connected via a plurality of signal lines.

As shown in FIG. 1, the delay line 1021 is connected to the input circuit 101 and the selection circuit 1022. The delay line 1021 is configured to receive the "synchronization reference signal (202)" output from the input circuit 101, and to delay the signal only by predetermined delay time, thereby generating a plurality of "delayed synchronization reference signals (203)".

As shown in FIG. 1, the selection circuit 1022 is connected to the external circuits, the delay line 1021, the timing offset circuit 103, and the first control circuit 106. The selection circuit 1022 is configured to select one of the plurality of "delayed synchronization reference signals (203)" output from the delay line 1021 in accordance with a "control signal (207) (describe later)" output from the first control circuit 106. The selection circuit 1022 is configured to output selected one to the external circuit as a "DLL output signal (204)".

As shown in FIG. 1, the timing offset circuit 103 is connected to the external circuit, the selection circuit 1022 of the first delay module 102, and the second delay module 104. The timing offset circuit 103 is configured to receive the "DLL output signal (204)" output from the selection circuit 1022, to adjust a synchronization position, thereby generating a "signal (205) to be synchronized", and to output the signal (205) to be synchronized to the second delay module 104.

As shown in FIG. 1, the second delay module 104 has five delay circuits 1041 to 1045 and a phase comparison target selection circuit 1046. The delay circuits 1041 to 1045 are serially connected to the phase comparison target selection circuit 1046.

As shown in FIG. 1, the delay circuits 1041 to 1045 are connected to the timing offset circuit 103 and the phase comparison target selection circuit 1046. Each delay circuits 1041 to 1045 has different delay time (D1 to D5). For example, in the case where the operation frequency of a processor mounted on the LSI is 1 GHz, D1=20 ps (delay time of the delay circuit 1041), D2=40 ps (delay time of the delay circuit 1042), D3=60 ps (delay time of the delay circuit 1043), D4=80 ps (delay time of the delay circuit 1044), and D5=100 ps (delay time of the delay circuit 1045). Each delay circuits 1041 to 1045 is configured to receive the signal (205) to be synchronized from the timing offset circuit 103, to delay the signal (205) to be synchronized only by predetermined delay time, thereby generating a plurality of "delayed synchronization target signals (2081 to 2085), and to output the delayed signals to the phase comparison target selection circuit 1046. The number of the delay circuits 1041 to 1045 may be two or more.

As shown in FIG. 1, the phase comparison target selection circuit 1046 is connected to the delay circuits 1041 to 1045 and the phase comparison circuit 105. The phase comparison target selection circuit 1046 is configured to select one a plurality of the "delayed synchronization target signals (2081 to 2085)" output from the delay circuits 1041 to 1045 in accordance with a "selection signal (214)" output from a selection signal generation circuit 1073 (described later), and to output the selected one to the phase comparison circuit 105 as a selection delayed synchronization target signal (209) which is an output signal of the second delay module 104.

As shown in FIG. 1, the phase comparison circuit 105 is connected to the input circuit 101, the phase comparison target selection circuit 1046 of the second delay module 104, and the first control circuit 106. The phase comparison circuit 105 is configured to receive the "synchronization reference signal (202)" output from the input circuit 101 and the "selection delayed synchronization target signal (209)" output from the phase comparison target selection circuit 1046, to compare the phases of both signals, and to output a "comparison result (206)" to the first control circuit 106.

As shown in FIG. 1, the first control circuit 106 is connected to the selection circuit 1022 of the first delay module 102, the phase comparison circuit 105, and a cycle counter 1071 (described later) of the second control circuit 107. The first control circuit 106 is configured to receive the "comparison result (206)" output from the phase comparison circuit 105, to generate the "control signal (207)" for controlling the selection circuit 1022 in accordance with the "comparison result (206)", and to output the "control signal (207)" to the selection circuit 1022. The first control circuit 106 also is configured to generate a "cycle counter enable signal (210)" for setting the cycle counter 1071 into an enable state in accordance with the "comparison result (206)", and to output the cycle counter enable signal (210) to the cycle counter 1071. When the "cycle counter enable signal (210)" is generated by the first control circuit 106, the DLL circuit enters a so-called "locked state".

As shown in FIG. 1, the second control circuit 107 has the cycle counter 1071, a comparison circuit 1072, and a selection signal generating circuit 1073. The second control circuit 107 is connected to the configuration information memory 108.

As shown in FIG. 1, the cycle counter 1071 is connected to the first control circuit 106 and the comparison circuit 1072. The cycle counter 1071 is configured to start counting the number of cycles in response to the "cycle counter enable signal (210)" output from the first control circuit 106, and to output a "cycle count value (212)" to the comparison circuit 1072. The cycle counter 1071 is configured to reset the cycle count value when the "comparison result (212)" of the comparison circuit 1072 indicates a "match".

As shown in FIG. 1, the comparison circuit 1072 is connected to the cycle counter 1071 and the selection signal generating circuit 1073. The comparison circuit 1072 is configured to compare the "cycle count value (212)" output from the cycle counter 1071 with a predetermined "delay circuit switching cycle set value (211)" and to output a "comparison result (213)" to the selection signal generating circuit 1073.

As shown in FIG. 1, the selection signal generating circuit 1073 is connected to the comparison circuit 1072 and the phase comparison target selection circuit 1046. The selection signal generating circuit 1073 is configured to generate a "selection signal (214)" for controlling the phase comparison target selection circuit 1046 in accordance with the "comparison result (213)" output from the comparison circuit 1072, and to output the "selection signal (214)" to the phase comparison target selection circuit 1046. The selection signal generating circuit 1073 generates the "selection signal (214)" so as to select the "delayed synchronization target signal (2083)" output from a delay circuit having the longest delay time next to that of the delay circuit selected just before (for example, the delay circuit 1044 in the case where the delay circuit 1043 is selected just before). On the other hands, when the DLL circuit is in the unlocked state, the selection signal generating circuit 1073 generates the "selection signal (214)" so as to select the "delayed synchronization target signal (2083)" shown in unlocked output signal information 108a. The selection signal generating circuit 1073 may generate the "selection signal (214)" so as to select a "delayed synchronization target signal" output from a delay circuit having the shortest delay time next to that of a delay circuit selected just before. In the case where the delay circuit selected just before is a delay circuit having the shortest delay time (or the longest delay time), the selection signal generating circuit 1073 may generate the "selection signal (214)" so as to select a "delayed synchronization target signal" output from the delay circuit having the longest delay time (or the shortest delay time).

As shown in FIG. 1, the configuration information memory 108 is connected to the second control circuit 107. The configuration information memory 108 is configured to store the unlocked output signal information 108a, on/off information 108c, and suspension period information 108d. The unlocked output signal information 108a is indicative of the output signal of the second delay module 104 to be selected in the case of the unlocked state (that is the DLL circuit is not in the locked state). The on/off information 108c is indicative of on/off of the second control circuit 107. The suspension period information 108d indicative of a time range of on/off of the second control circuit 107. Setting the unlocked output signal information 108a, on/off information 108c, and suspension period information 108d is performed by software executed in the LSI having the DLL circuit of the first embodiment of the present invention or pins (not shown) of the configuration information memory 108.

Figure 2:
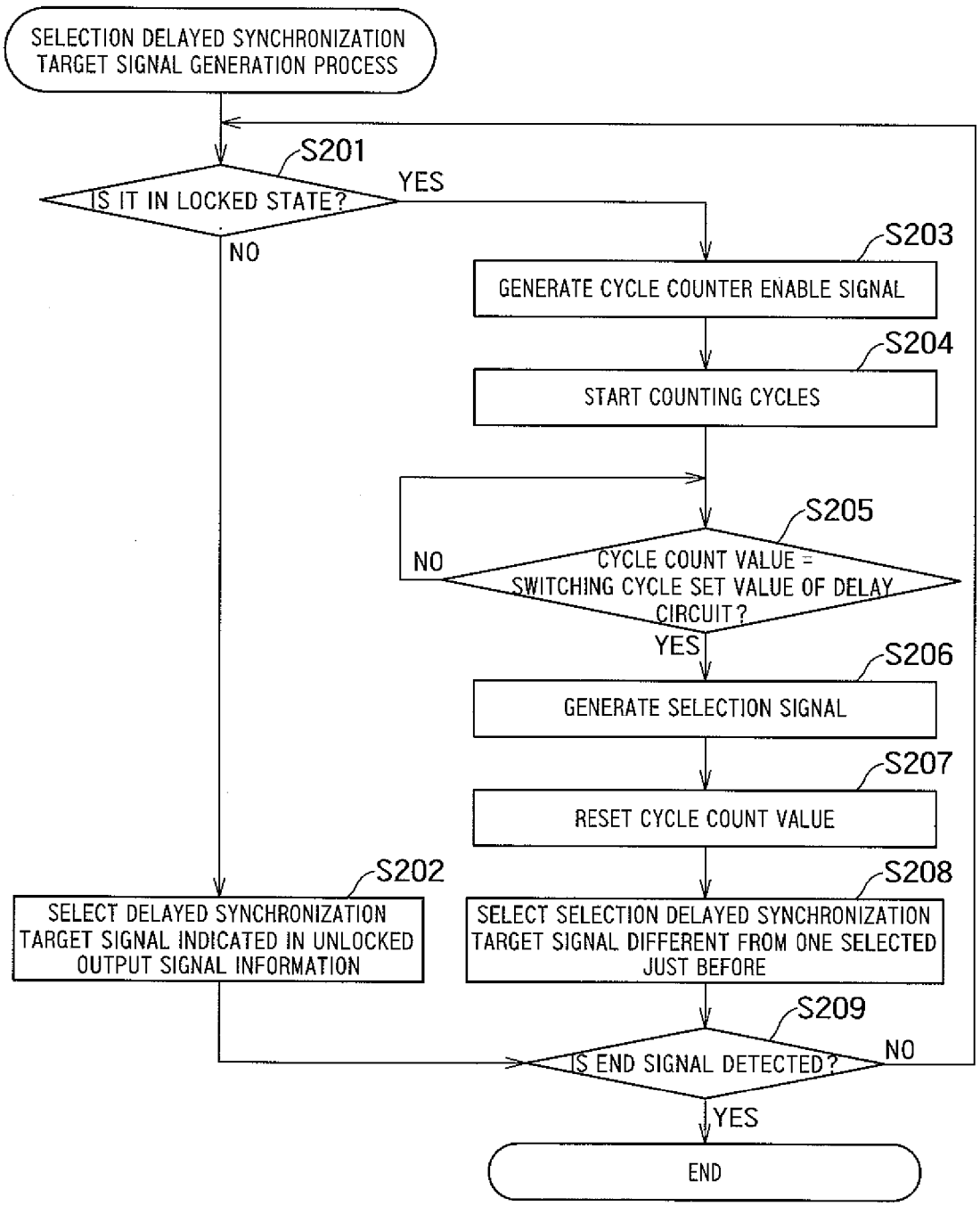
FIG. 2 is a flowchart showing the procedure of the DLL circuit in the selection delayed synchronization target signal generation process of the first embodiment of the present invention.
Figure 3:
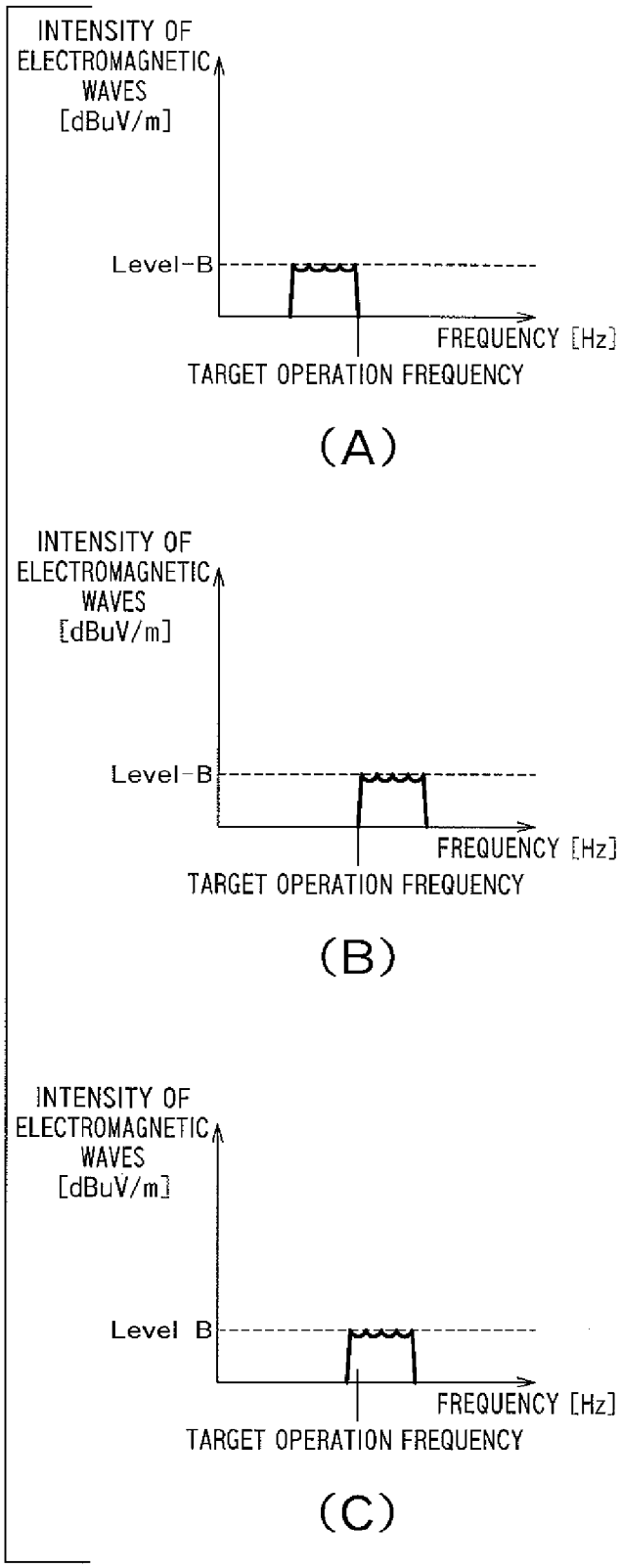
FIG. 3 is a graph showing distribution of frequency of the intensity of electromagnetic waves of the first invention of the present invention.

Process of the DLL circuit of the first embodiment of the present invention will be described. FIG. 2 is a flowchart showing the procedure of the DLL circuit in the selection delayed synchronization target signal generation process of the first embodiment of the present invention. FIG. 3 is a graph showing distribution of frequency of the intensity of electromagnetic waves of the first invention of the present invention.

First, as shown in FIG. 2, when the DLL circuit is in the unlocked state (S201—NO), the selection signal generating circuit 1073 refers the unlocked output signal information 108a stored in the configuration information memory 108, generate the selection signal (214) so as to select one of the delayed synchronization target signals (2081 to 2085) indicated in the unlocked output information, and outputs the selection signal (214) to the phase comparison target selection circuit 1046 (S202). At this time, the phase comparison target selection circuit 1046 selects one of the delayed synchronization target signals (2081 to 2085), and outputs the selected signal to the phase comparison circuit 105.

On the other hand, when the DLL circuit is in the locked state (S201—YES), the first control circuit 106 generates the "cycle counter enable signal (210)" (S203). Next, the cycle counter 107 starts counting the cycles (S204). Next, in the case where the "comparison result (213)" output from the comparison circuit 1072 shows a match (S205—YES), the selection signal generation circuit 1073 generates the "selection signal (214)" (S206). Next, the cycle counter 107 resets the cycle count value (S207). Next, the phase comparison target selection circuit 1046 selects the selection delayed synchronization target signal (209) output from a delay circuit different from the delay circuit selected just before (for example, a delay circuit having the longest delay time next to that of the delay circuit selected just before) (S208).

The steps S201 to S208 are repeated until an end signal is detected (S209—NO).

On the other hand, when the end signal is detected after the step S202 or S208 (S209—YES), the selection delayed synchronization target signal generation process of the first embodiment of the present invention is completed. The end signal is detected in the case where the LSI shifts to a sleep state, is reset, or shifts to a power saving mode. In the power saving mode, the DLL circuit of the first embodiment of the present invention stops the operation of the timing offset circuit 103, the second delay module 104, the phase comparison circuit 105, and the second control circuit 107. The first delay module 102 outputs the "DLL output signal (204)" at a constant frequency.

In the first embodiment of the present invention, in the case where the DLL circuit is in the unlocked state, the output signal of the second delay module 104 is decided based on the unlocked output signal information 108a stored in the configuration information memory 108. Therefore, users can optionally change the distribution of frequency of the intensity of electromagnetic waves by setting the optional unlocked output signal information 108a. For example, as shown in FIG. 3(A), users can set the unlocked output signal information 108a so that a top of the peak of the intensity of electromagnetic waves appears at the target operation frequency. As shown in FIG. 3(B), users can set the unlocked output signal information 108a so that a bottom of the peak of the intensity of electromagnetic waves appears at the target operation frequency. As shown in FIG. 3(C), users can set the unlocked output signal information 108a so that the target operation frequency is not matched with a center of the intensity of electromagnetic waves.

In the modification of the first embodiment of the present invention, the second control circuit 107 may operate only while the on/off information 108c stored in the configuration information memory 108 is indicative of "on". In this case, the process shown in FIG. 2 is executed only while the on/off information 108c stored in the configuration information memory 108 is indicative of "on". In this case, the DLL circuit of the modification of the first embodiment of the present invention can be applied to the LSI that needs the second control circuit 107. As a result, production cost is reduced.

In another modification of the first embodiment of the present invention, the cycle counter 1071 may suspend to count only for the time range indicated in the suspension period information 108d stored in the configuration information memory 108. In this case, the phase comparison target selection circuit 1046 continuously selects the selection delayed synchronization target signal (209) which is selected just before. In this case, the DLL circuit of another modification of the first embodiment of the present invention can be applied to the LSI that needs jitter reduction for high accuracy and high speed transfer.

Figure 4:
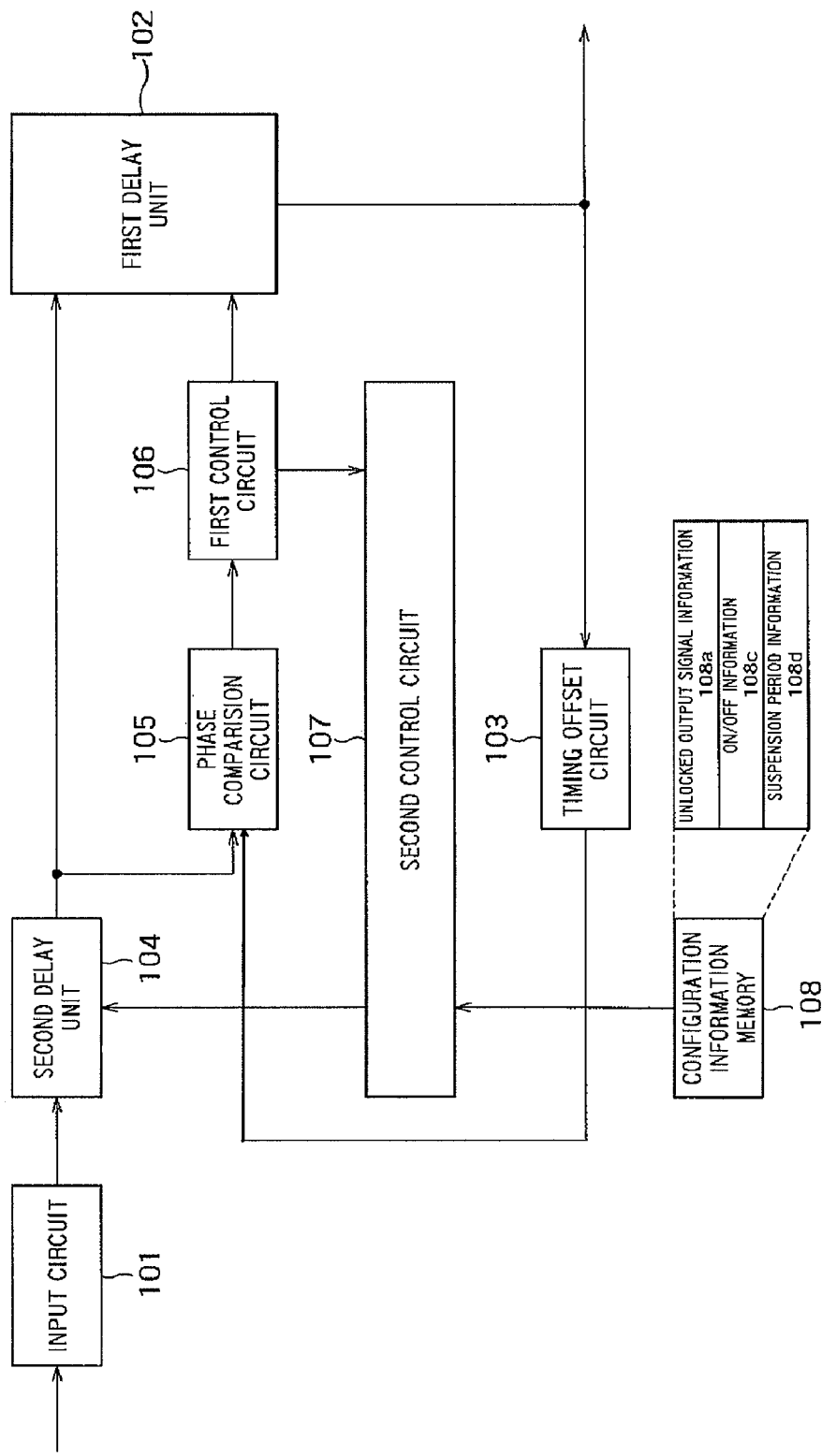
FIGS. 4 and 5 are circuit diagrams showing the configuration of a DLL circuit of the modifications of the first embodiment of the invention.

In another modification of the first embodiment of the present invention, as shown in FIG. 4, between the input circuit 101, the first delay module 102, and the phase comparison circuit 105, the second delay module 104 which is configured to delay the synchronization reference signal may be located, the second control circuit 107 may be connected to the second delay module 104, and the configuration information memory 108 may be connected to the second control circuit 107.

Figure 5:
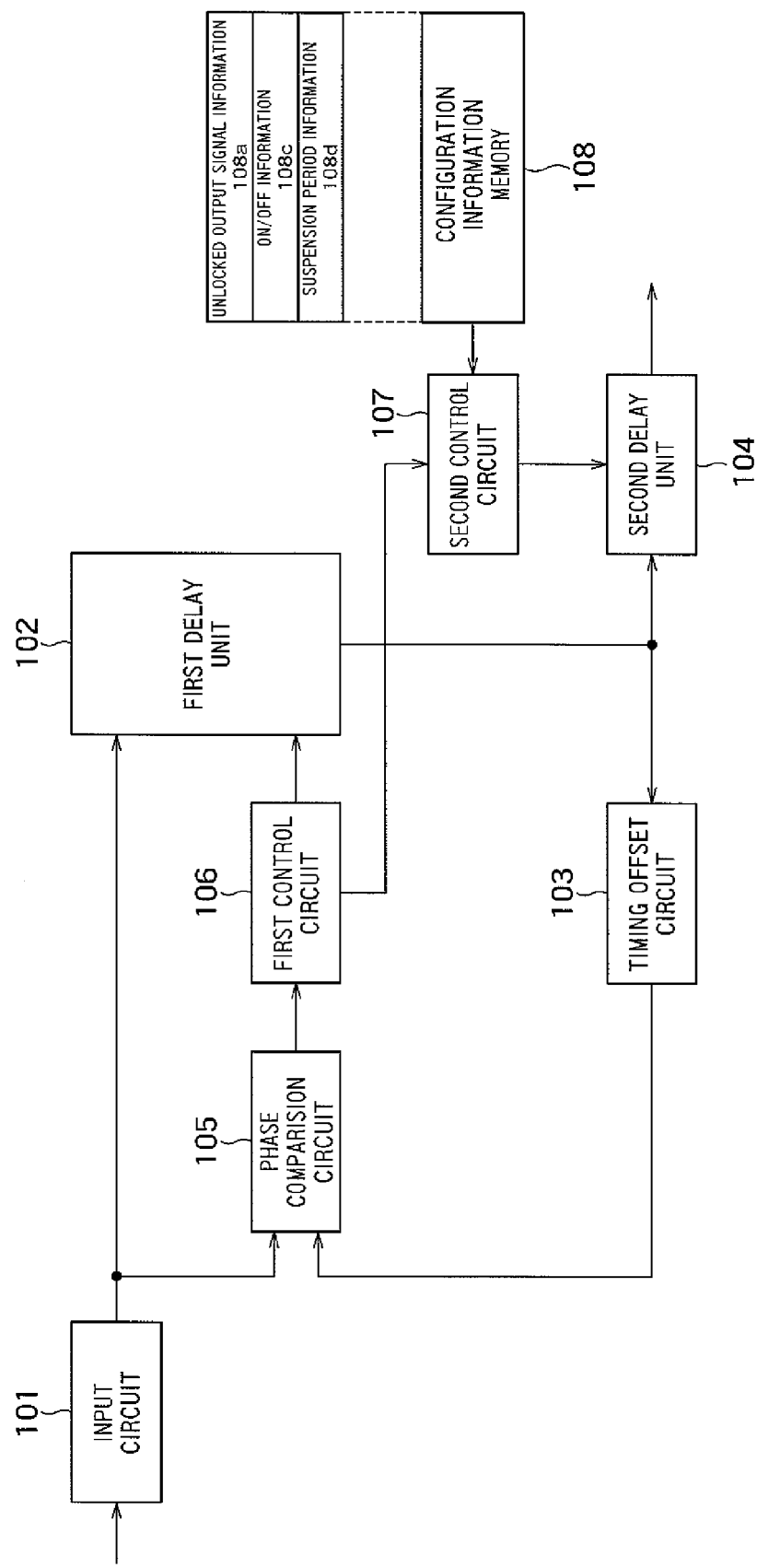

In another modification of the first embodiment of the present invention, as shown in FIG. 5, the second delay module 104 which is configured to delay the DLL output signal may be located at the output side of the DLL circuit, the second delay module 104 may be connected to the second control circuit 107, and the configuration information memory 108 may be connected to the second control circuit 107.

According to the first embodiment of the present invention, the second control circuit 107 operates based on the configuration information 108a, 108c, or 108d stored in the configuration information memory 108. Therefore, the distribution of frequency of the intensity of electromagnetic waves can be shifted depending on the use or the operation situation of the LSI.

Embodiment 2

A second embodiment of the present invention will be described. In the second embodiment of the present invention, an example of the DLL circuit having the switching cycle selection circuit which is configured to select one corresponding to the selected delay circuit of a plurality of switching cycle set values. The description similar to that of the first embodiment of the present invention will not be repeated.

Configuration of a DLL circuit of the second embodiment of the present invention will be described. FIG. 6 is a circuit diagram showing the configuration of a DLL circuit of the second embodiment of the invention.

As shown in FIG. 6, the DLL circuit of the second embodiment of the present invention has the input circuit 101, a first delay module 102, the timing offset circuit 103, the second delay module 104, the phase comparison circuit 105, the first control circuit 106, the second control circuit 107, the configuration information memory 108, and a switching cycle selection circuit 109. The input circuit 101, the first delay module 102, the timing offset circuit 103, the second delay module 104, the phase comparison circuit 105, and the first control circuit 106 are same to them of the first embodiment of the present invention.

As shown in FIG. 6, the second control circuit 107 has a cycle counter 1071, a comparison circuit 1072, and a selection signal generating circuit 1073. The cycle counter 1071 is same to one of the first embodiment of the present invention.

As shown in FIG. 6, the comparison circuit 1072 is connected to the cycle counter 1071, the selection signal generating circuit 1073, and the switching cycle selection circuit 109. The comparison circuit 1072 is configured to compare the "cycle count value (212)" output from the cycle counter 1071 with selected one of switching cycle set values 108e to 108i (described later) and to output a "comparison result (213)" to the selection signal generating circuit 1073.

As shown in FIG. 6, the selection signal generating circuit 1073 is connected to the comparison circuit 1072, the phase comparison target selection circuit 1046, and the switching cycle selection circuit 109. The selection signal generating circuit 1073 is configured to generate a "selection signal (214)" for controlling the phase comparison target selection circuit 1046 in accordance with the "comparison result (213)" output from the comparison circuit 1072, and to output the "selection signal (214)" to the phase comparison target selection circuit 1046 and the switching cycle selection circuit 109.

As shown in FIG. 6, the configuration information memory 108 is connected to the switching cycle selection circuit 109. The configuration information memory 108 is configured to store a plurality of switching cycle set values 108e to 108i. Each switching cycle set values 108e to 108i is configuration information corresponding to each delay circuits 1041 to 1045 of the second delay module 104 and is indicative of the switching cycle of the comparison circuit 1072 of the second control circuit 107. In other words, the each switching cycle set values 108e to 108i is indicative of a time range for selecting the output signal of the second delay module 104. The switching cycle set values 108e to 108i are set using software executed on the LSI having the DLL circuit of the second embodiment of the present invention or by pins (not shown) of the configuration information memory 108.

As shown in FIG. 6, the switching cycle selection circuit 109 is connected to the comparison circuit 1072 and the selection signal generating circuit 1073 of the second control circuit 107, and the configuration information memory 108. The switching cycle selection circuit 109 is configured to read out one corresponding to the selection delayed synchronization target signal (209) of a plurality of switching cycle set values 108e to 108i from the configuration information memory 108, and to output one read out to the comparison circuit 1072.

Figure 7:
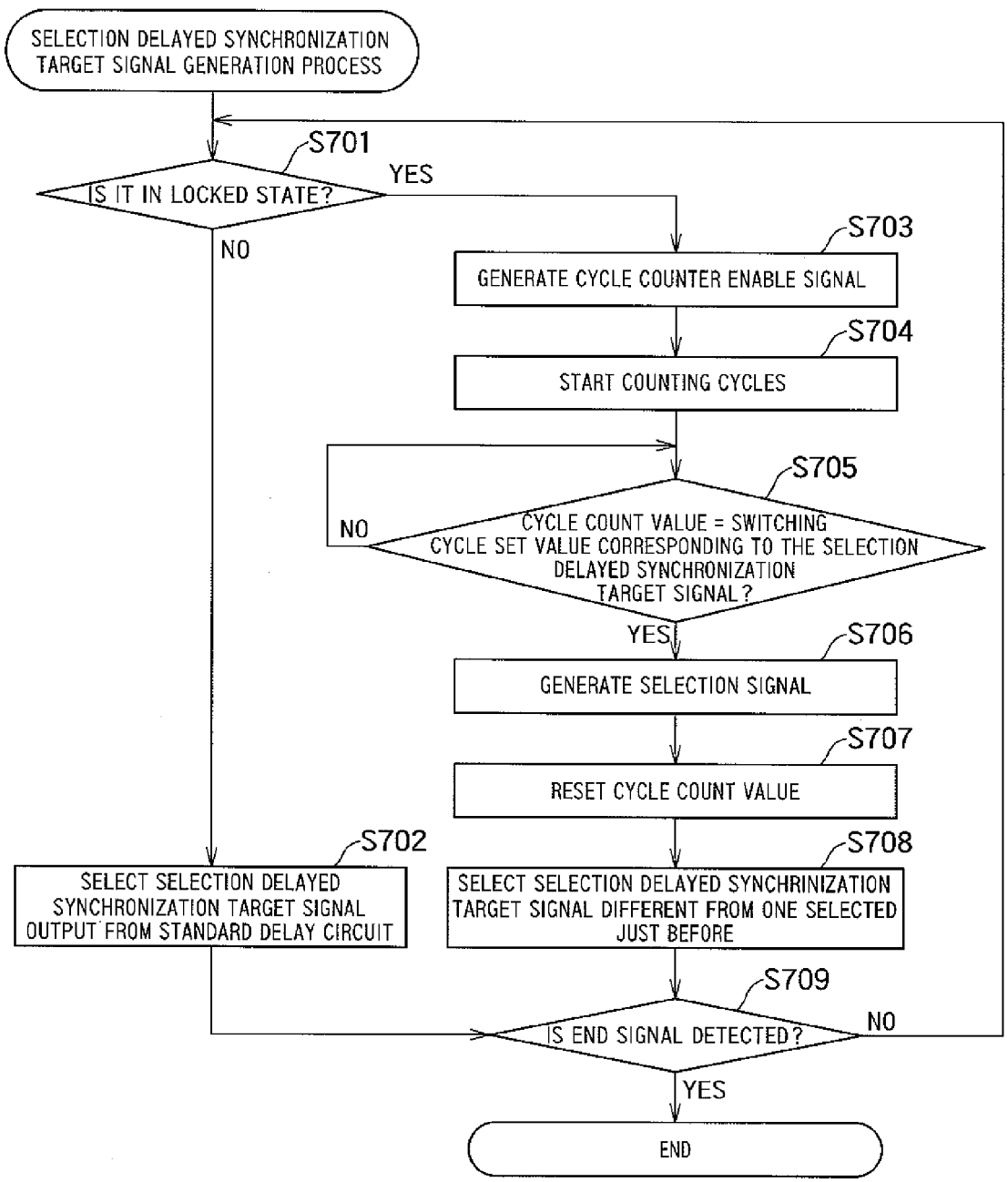
FIG. 7 is a flowchart showing the procedure of the DLL circuit in the selection delayed synchronization target signal generation process of the second embodiment of the present invention.
Figure 8:
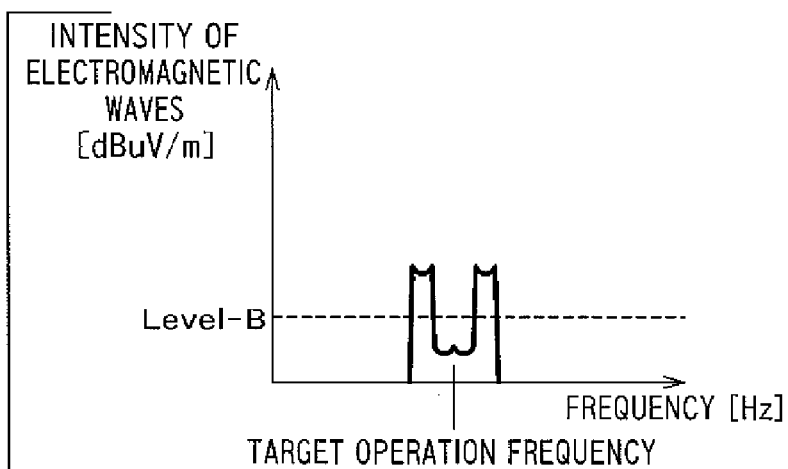
FIG. 8 is a graph showing distribution of frequency of the intensity of electromagnetic waves of the second invention of the present invention.
Figure 8:
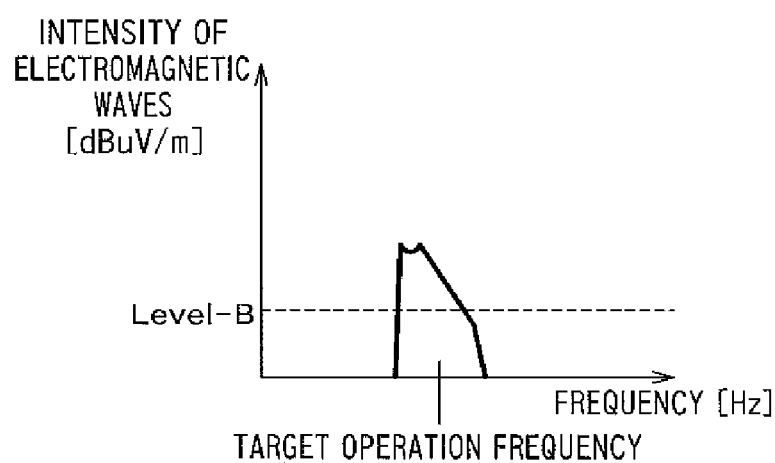

Process of the DLL circuit of the second embodiment of the present invention will be described. FIG. 7 is a flowchart showing the procedure of the DLL circuit in the selection delayed synchronization target signal generation process of the second embodiment of the present invention. FIG. 8 is a graph showing distribution of frequency of the intensity of electromagnetic waves of the second invention of the present invention.

First, as shown in FIG. 7, when the DLL circuit is in the unlocked state (S701—NO), the phase comparison target selection circuit 1046 select a standard delayed synchronization target signal", for example delayed synchronization target signal (2083)", output from a standard delay circuit, for example the delay circuit 1043 (S702).

On the other hand, when the DLL circuit is in the locked state (S701—YES), the first control circuit 106 generates the "cycle counter enable signal (210)" (S703). Next, the cycle counter 107 starts counting the cycles (S704). Next, in the case where the cycle count value (212) matches one corresponding to the selection delayed synchronization target signal (209) of a plurality of the switching cycle set values 108e to 108i (the "comparison result (213)" output from the comparison circuit 1072 shows a match) (S705—YES), the selection signal generation circuit 1073 generates the "selection signal (214)" (S706). Next, the cycle counter 107 resets the cycle count value (S707). Next, the phase comparison target selection circuit 1046 selects the selection delayed synchronization target signal (209) output from a delay circuit different from the delay circuit selected just before (for example, a delay circuit having the longest delay time next to that of the delay circuit selected just before) (S708).

The steps S701 to S708 are repeated until an end signal is detected (S709—NO).

On the other hand, when the end signal is detected after the step S702 or S708 (S709—YES), the selection delayed synchronization target signal generation process of the second embodiment of the present invention is completed. The end signal is detected in the case where the LSI shifts to a sleep state, is reset, or shifts to a power saving mode. In the power saving mode, the DLL circuit of the second embodiment of the present invention stops the operation of the timing offset circuit 103, the second delay module 104, the phase comparison circuit 105, and the second control circuit 107. The first delay module 102 outputs the "DLL output signal (204)" at a constant frequency.

In the second embodiment of the present invention, the output signal of the second delay module 104 in the locked state is defined based on the switching cycle set values 108e to 108i stored in the configuration information memory 108. Therefore, users can optionally change the distribution of frequency of the intensity of electromagnetic waves by setting the switching cycle set values 108e to 108i. For example, as shown in FIG. 8(A), users can change the distribution of frequency of the intensity of electromagnetic waves so that the peak of the intensity of electromagnetic waves appears around the target operation frequency. As shown in FIG. 8(B), users can change the distribution of frequency of the intensity of electromagnetic waves so that the peak of the intensity of electromagnetic waves appears at a lower frequency than the target operation frequency, and so that the intensity of electromagnetic waves becomes lower as the frequency becomes higher.

Figure 9:
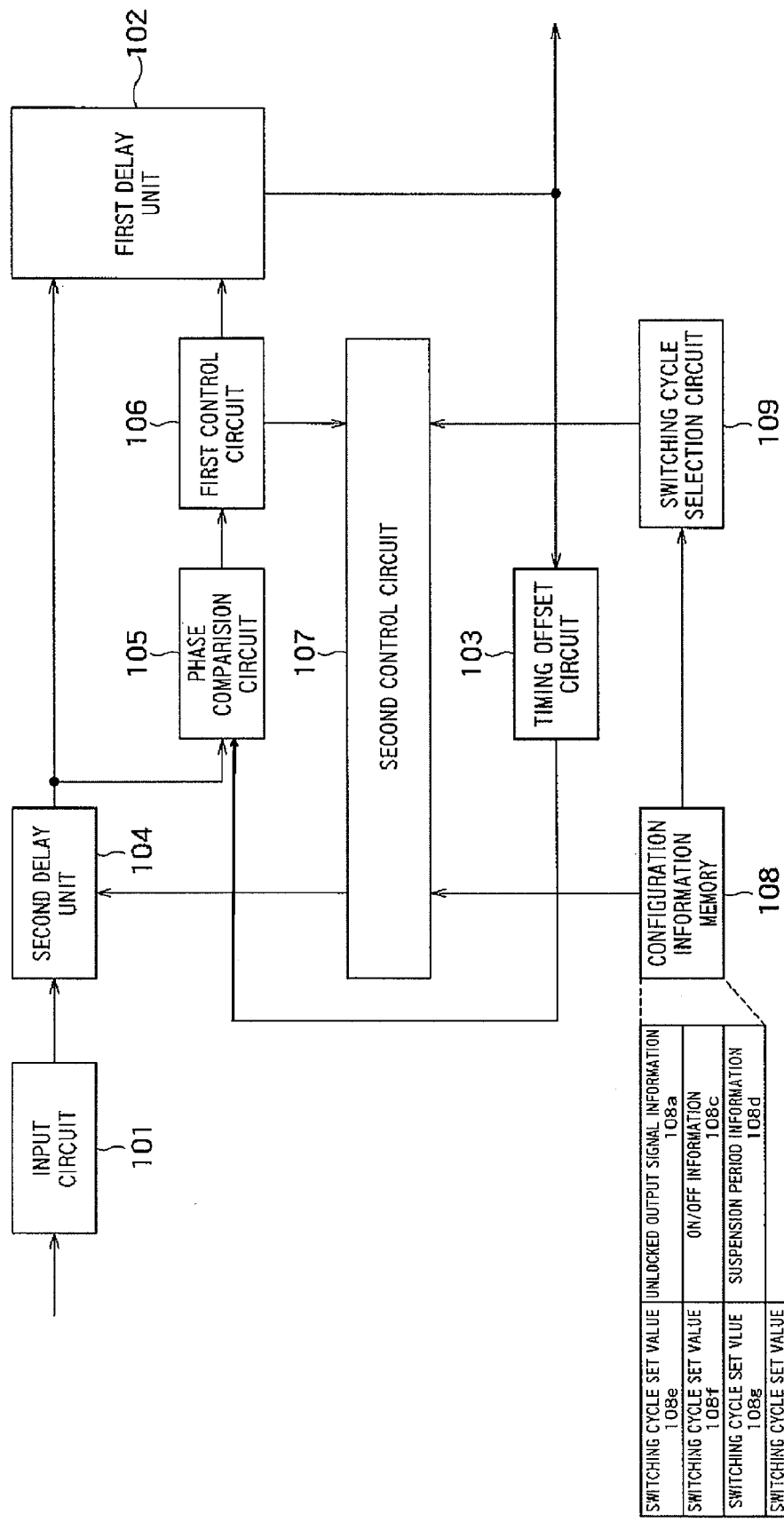
FIGS. 9 to 11 are circuit diagrams showing the configuration of a DLL circuit of the modifications of the second embodiment of the invention.

In the modification of the second embodiment of the present invention, as shown in FIG. 9, the configuration information memory 108 may store the unlocked output signal information 108a, on/off information 108c, and suspension period information 108d. In this case, the configuration information memory 108 is also connected to the second control circuit 107. The step of S702 in FIG. 7 is the same as the step of S202 in FIG. 2.

Figure 10:
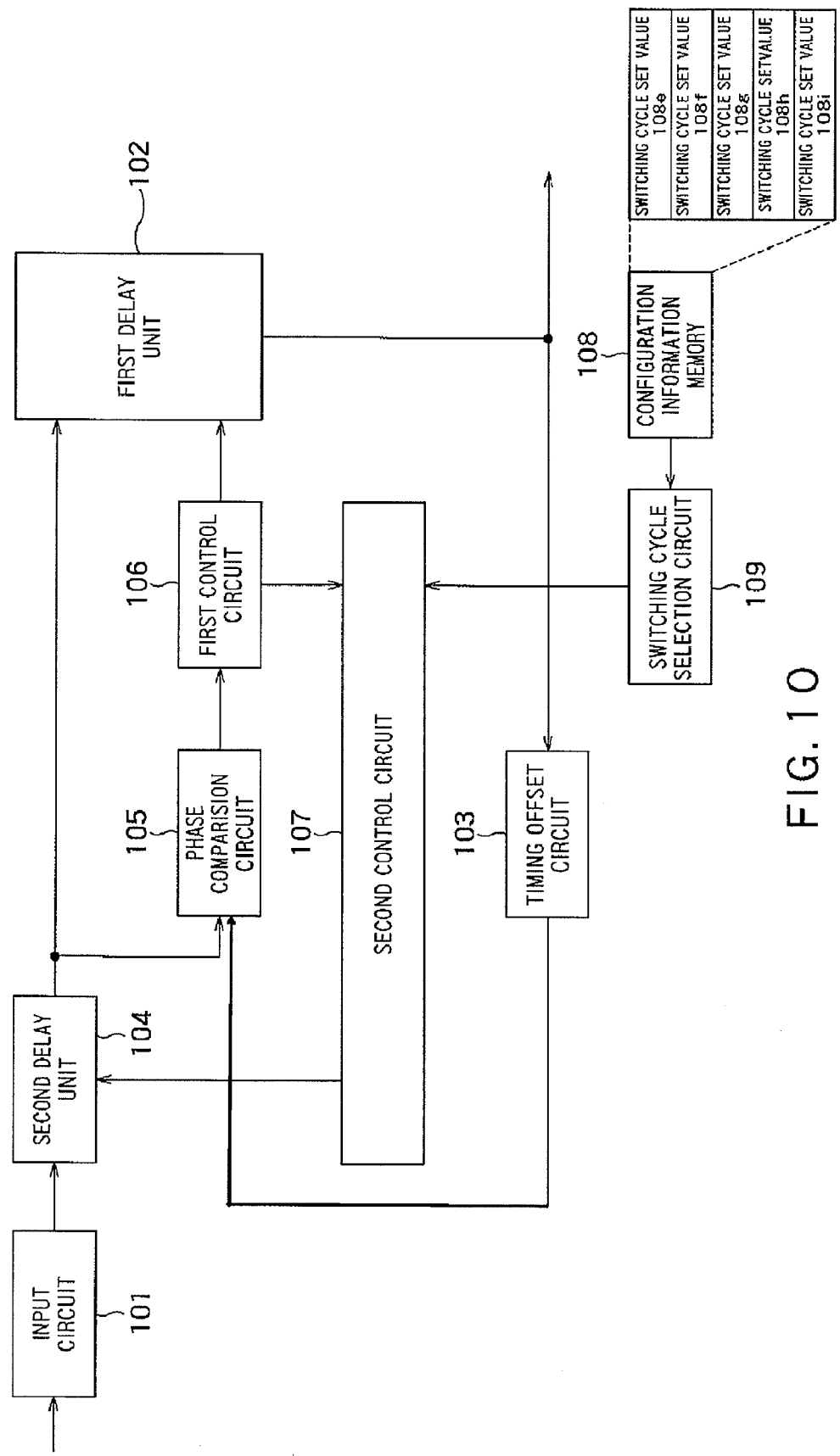

In another modification of the second embodiment of the present invention, as shown in FIG. 10, between the input circuit 101, the first delay module 102, and the phase comparison circuit 105, the second delay module 104 which is configured to delay the synchronization reference signal may be located, the second control circuit 107 may be connected to the second delay module 104, the second control circuit 107 may be connected to the switching cycle selection circuit 109, and the switching cycle selection circuit 109 may be connected to the configuration information memory 108.

Figure 11:
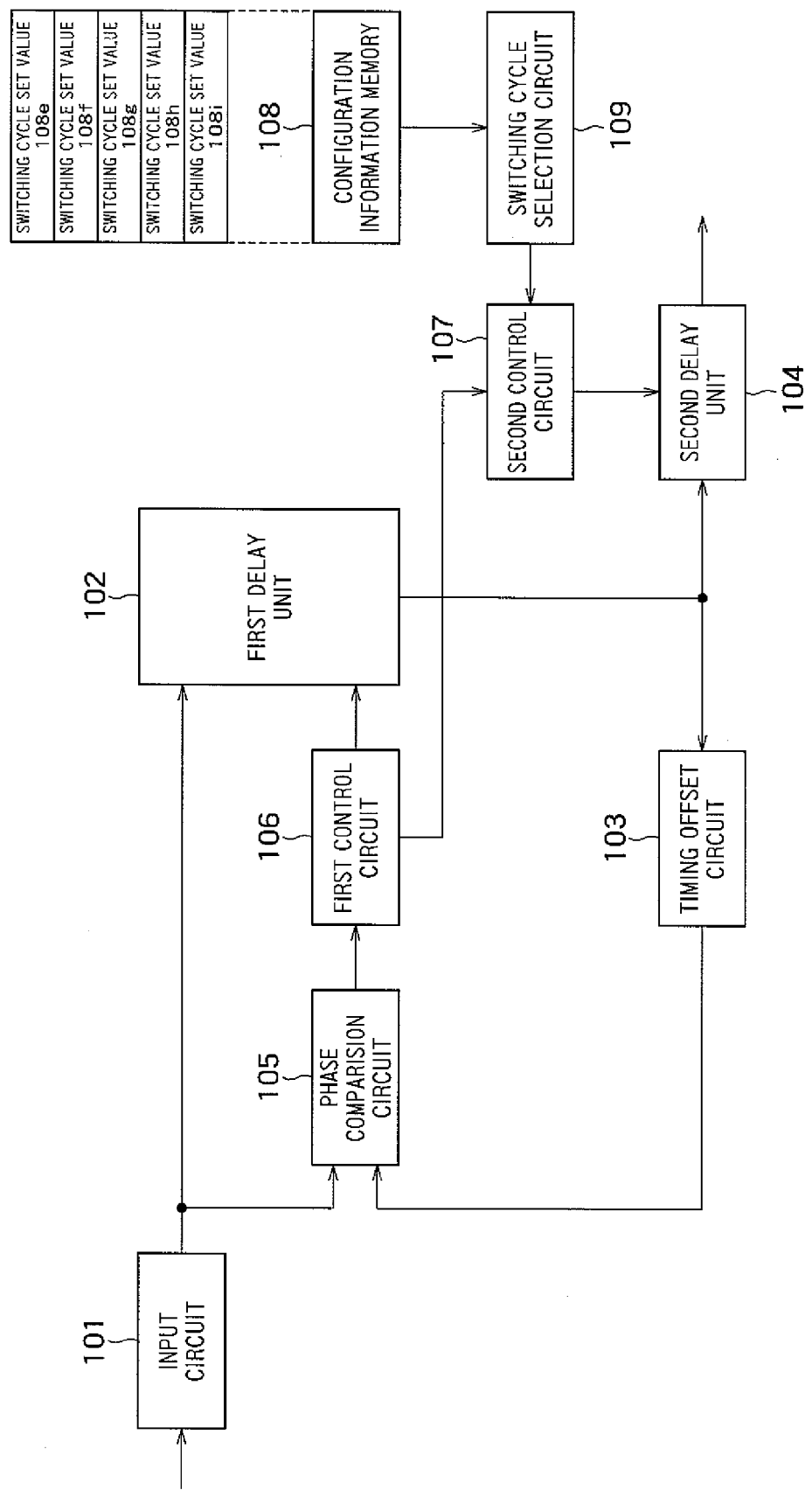

In another modification of the second embodiment of the present invention, as shown in FIG. 11, the second delay module 104 which is configured to delay the DLL output signal may be located at the output side of the DLL circuit, the second control circuit 107 may be connected to the switching cycle selection circuit 109, and the configuration information memory 108 may be connected to the switching cycle selection circuit 109.

According to the second embodiment of the present invention, the switching cycle selection circuit 109 selects one of the switching cycle set values 108e to 108i stored in the configuration information memory 108, and outputs the selected one to the comparison circuit 1072. Therefore, the form of the distribution of frequency of the intensity of electromagnetic waves can be controlled depending on the use or the operation situation of the LSI.

The various modules of the systems described herein can be implemented as software applications, hardware and/or software modules, and/or components on one or more computers, such as servers and/or through transistors or other integrated circuits. While the various modules are illustrated separately, they may share some or all of the same underlying logic or code.

What is claimed is:

1. A Delay Locked Loop (DLL) circuit comprising:
    an input circuit configured to receive an input signal, and to generate a synchronization reference signal on the basis of the input signal;
    a first delay module configured to delay the synchronization reference signal in order to generate a plurality of delayed versions of the synchronization reference signal and to select one of the delayed versions of the synchronization reference signal as an output;
    a timing offset circuit configured to adjust a synchronization position of the selected delayed version of the synchronization reference signal in order to generate a signal to be synchronized;
    a phase comparison circuit configured to compare the phase of the synchronization reference signal with the phase of a selected one of a plurality of delayed versions of the signal to be synchronized;
    a first controller configured to control the selection of one of the plurality of delayed versions of the synchronization reference signal as the output signal of the first delay module on the basis of a comparison result of the phase comparison circuit;
    a second delay module connected to the timing offset circuit and configured to delay the signal to be synchronized in order to generate the plurality of delayed versions of the signal to be synchronized;
    a configuration information memory configured to store configuration information indicative of an output signal of the second delay module to be selected when the DLL is in an unlocked state; and
    a second controller connected to the configuration information memory and configured to select one of the plurality of delayed versions of the signal to be synchronized as the output signal of the second delay module based on the configuration information stored in the configuration information memory in the case where the comparison result of the phase comparison circuit is within a predetermined range.

2. The DLL circuit of claim 1, wherein the configuration information memory is configured to store configuration information indicative of an on and off state of the second controller.

3. The DLL circuit of claim 2, wherein the configuration information memory is configured to store a suspension period of the second delay module.

4. The DLL circuit of claim 1 wherein the second delay module is further connected to the phase comparison circuit and the second controller.

5. A Delay Locked Loop (DLL) circuit comprising:
    an input circuit configured to receive an input signal, and to generate a synchronization reference signal on the basis of the input signal;
    a first delay module;
    a second delay module connected to the input circuit and configured to delay the synchronization reference signal in order to generate a plurality of delayed versions of the synchronization reference signal, and to select one of the plurality of delayed versions of the synchronization reference signal as an output of the second delay module, wherein the first delay module is configured to delay the output of the second delay module in order to generate a plurality of delayed versions of the output of the second delay module and to select one of the delayed versions of the output of the second delay module as an output of the first delay module;

a timing offset circuit configured to adjust a synchronization position of the output of the first delay module in order to generate a signal to be synchronized;

a phase comparison circuit configured to compare the phase of the output of the second delay module with the phase of the signal to be synchronized;

a first controller configured to control the selection of one of the plurality of delayed versions of the output of the second delay module as the output of the first delay module on the basis of a comparison result of the phase comparison circuit;

a configuration information memory configured to store configuration information indicative of the output signal of the second delay module to be selected when the DLL is in an unlocked state; and a second controller connected to the configuration information memory and configured to select one of the plurality of delayed versions of the synchronization reference signal as the output signal of the second delay module based on the configuration information stored in the configuration information memory in the case where the comparison result of the phase comparison circuit is within a predetermined range.

6. The DLL circuit of claim 5, wherein the configuration information memory is configured to store configuration information indicative of an on and off state of the second controller.

7. The DLL circuit of claim 6, wherein the configuration information memory is configured to store a suspension period of the second delay module.

8. The DLL circuit of claim 5, wherein the second delay module is further connected to the first delay module and the second controller.

9. A Delay Locked Loop (DLL) circuit comprising:
an input circuit configured to receive an input signal, and to generate a synchronization reference signal on the basis of the input signal;
a first delay module configured to delay the synchronization reference signal in order to generate a plurality of delayed versions of the synchronization reference signal and to select one of the delayed versions of the synchronization reference signal as an output;
a timing offset circuit configured to adjust a synchronization position of the selected delayed version of the synchronization reference signal in order to generate a signal to be synchronized;
a phase comparison circuit configured to compare the phase of the synchronization reference signal with the phase of the signal to be synchronized;
a first controller configured to control the selection of one of the plurality of delayed versions of the synchronization reference signal as the output signal of the first delay module on the basis of a comparison result of the phase comparison circuit;
a second delay module connected to the first delay module and configured to delay the output signal of the first delay module in order to generate a plurality of delayed versions of the output of the first delay module;
a configuration information memory configured to store configuration information indicative of an output signal of the second delay module to be selected when the DLL is in an unlocked state; and
a second controller connected to the configuration information memory and configured to select one of the plurality of delayed versions of the output of the first delay module as the output signal of the second delay module based on the configuration information stored in the configuration information memory in the case where the comparison result of the phase comparison circuit is within a predetermined range.

10. The DLL circuit of claim 9, wherein the configuration information memory is configured to store configuration information indicative of an on and off state of the second controller.

11. The DLL circuit of claim 9, wherein the configuration information memory is configured to store a suspension period of the second delay module.

12. The DLL circuit of claim 9, wherein the second delay module is further connected to the first delay module and the second controller.

13. A Delay Locked Loop (DLL) circuit comprising:
an input circuit configured to receive an input signal, and to generate a synchronization reference signal on the basis of the input signal;
a first delay module configured to delay the synchronization reference signal in order to generate a plurality of delayed versions of the synchronization reference signal and to select one of the delayed versions of the synchronization reference signal as an output;
a timing offset circuit configured to adjust a synchronization position of the selected delayed version of the synchronization reference signal in order to generate a signal to be synchronized;
a phase comparison circuit configured to compare the phase of the synchronization reference signal with the phase of a selected one of a plurality of delayed versions of the signal to be synchronized;
a first controller configured to control the selection of one of the plurality of delayed versions of the synchronization reference signal as the output signal of the first delay module on the basis of a comparison result of the phase comparison circuit;
a second delay module connected to the timing offset circuit and configured to delay the signal to be synchronized in order to generate the plurality of delayed versions of the signal to be synchronized;
a configuration information memory configured to store configuration information indicative of a time range for selecting an output signal of the second delay module; and
a second controller connected to the configuration information memory and configured to select one of the plurality of delayed versions of the signal to be synchronized as the output signal of the second delay module based on the configuration information stored in the configuration information memory in the case where the comparison result of the phase comparison circuit is within a predetermined range.

14. The DLL circuit of claim 13, wherein the second delay module is further connected to the phase comparison circuit and the second controller.

* * * * *